(12) United States Patent
Gattuso

(10) Patent No.: US 8,052,429 B1
(45) Date of Patent: Nov. 8, 2011

(54) SOCKET CONNECTOR HAVING RETAINING PLATE WITH HORIZONTALLY ACTUATED LOCKING TABS

(75) Inventor: Andrew David Gattuso, Chandler, AZ (US)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 13/069,388

(22) Filed: Mar. 23, 2011

(51) Int. Cl.
*H01R 12/00* (2006.01)
(52) U.S. Cl. .......................................... 439/73; 439/331
(58) Field of Classification Search ............... 439/73, 439/331, 342
See application file for complete search history.

(56) References Cited

U.S. PATENT DOCUMENTS

| | | | | |
|---|---|---|---|---|
| 4,761,140 A | * | 8/1988 | Geib | 439/71 |
| 6,244,875 B1 | * | 6/2001 | McHugh et al. | 439/73 |
| 6,334,786 B1 | * | 1/2002 | Lee | 439/331 |
| 7,083,456 B2 | | 8/2006 | Tyco | |
| 7,179,092 B2 | | 2/2007 | Hai | |
| 7,507,101 B2 | * | 3/2009 | Chiang | 439/331 |
| 2007/0243746 A1 | | 10/2007 | Molex | |

* cited by examiner

*Primary Examiner* — Tho D Ta
(74) *Attorney, Agent, or Firm* — Andrew C. Cheng; Wei Te Chung; Ming Chieh Chang

(57) ABSTRACT

A socket connector (100) for an electronic package includes an insulative housing (1) having a pair of keys (16) formed at a forward end (12) thereof, a plurality of terminals (3) received in the insulative housing (1) and a retention plate (2) rotatably coupled to the insulative housing (1) at a rearward end (11) thereof. The retention plate (2) has a pair of latches (22) formed at a pair of corners of the retention plate (2). Each latch (22) includes a locking portion (221) extending along the forward end to lock to the key (16) and a pressing portion (222) bent from the locking portion (221).

14 Claims, 5 Drawing Sheets

SOCKET CONNECTOR HAVING RETAINING PLATE WITH HORIZONTALLY ACTUATED LOCKING TABS

BACKGROUNDING OF THE INVENTION

1. Field of the Invention

The present invention relates to a socket connector, and more particularly to a socket connector incorporated with a retention plate actuated by a pair of horizontally triggered locking tabs.

2. Description of the Prior Art

A conventional socket connector for an electronic package disclosed in U.S. Pat. No. 7,179,092 issued to Ma on Feb. 20, 2007 includes an insulative housing, a number of terminals received in the insulative housing and a retaining assembly surrounding the insulative housing. The insulative housing is provided with a receiving portion accommodating the electronic package therein. The retaining assembly includes a stiffener disposed around the insulative housing, a load plate pivotably coupled to one end of the stiffener and a lever assembled to opposite end of the stiffener. The load plate presses the electronic package disposed in the insulative housing, and finally the lever presses is rotated to press the load plate. The dimension of the retaining assembly is larger than that of the insulative housing so that it occupies comparably larger space on a circuit board and needs much more metal material. Accordingly, it cannot meet the trend of low cost. The load plate of the retaining assembly is retained on the insulative housing via being pressed by the lever, and the lever is locked to the stiffener. Thereby, it has to provide a space for rotation of the lever therefore the retaining means is complicated.

In view of the above, an improved socket connector that overcomes the above-mentioned disadvantages is desired.

SUMMARY OF THE INVENTION

Accordingly, an object of the present invention is to provide a socket connector with a pair of locking means to facilitate latching or releasing a retention plate thereof.

To fulfill the above-mentioned object, a socket connector for an electronic package includes an insulative housing having a pair of keys formed at a forward end thereof, a plurality of terminals received in the insulative housing and a retention plate rotatably coupled to the insulative housing at a rearward end thereof. The retention plate has a pair of latches formed at a pair of corners of the retention plate. Each latch includes a locking portion extending along the forward end to lock to the key and a pressing portion bent from the locking portion. The locking portions are locked or unlocked to the keys by means of pressing the pressing portions inwardly to latch or release the retention plate.

Other objects, advantages and novel features of the invention will become more apparent from the following detailed description when taken in conjunction with the accompanying drawings.

DETAILED DESCRIPTION OF THE PREFERRED EMBODIMENT OF THE INVENTION

Figure 1:
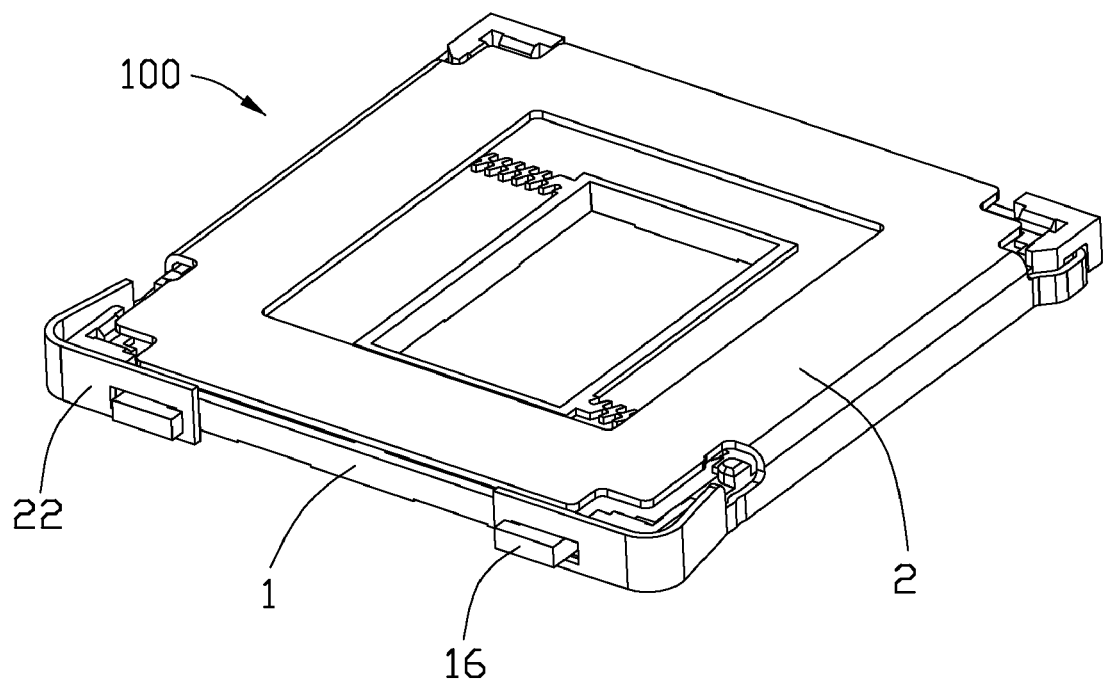
FIG. 1 is an assembled, perspective view of a socket connector in accordance with a preferred embodiment of the present invention, showing a retention plate in a closed portion.

Reference will now be made to the drawings to describe the present invention in detail.

Referring to FIGS. 1 to 5, a socket connector 100 for an electronic package (not shown) includes an insulative housing 1, a number of terminals 3 received in the insulative housing 1 and a retention plate 2 rotatably coupled to the insulative housing 1 at a rearward end 11 thereof. The retention plate 2 is movable between an open position (FIG. 2) and a closed position (FIG. 1) relative to the insulative housing 1. The socket connector 100 can be used to mount a central processing unit (CPU) or other chip carrying module to a circuit board (not shown).

The insulative housing 1 includes a base 10 which is fabricated from a dielectric material and substantially rectangular in shape, although other geometric forms and shapes may be employed in alternative embodiments. The insulative housing 1 includes a pair of rear corners 13 at the rearward end 11 and a pair of front corners 14 at a forward end 12 thereof. The rear corners 13 and the front corners 14 are above the base 10 to position the electronic package (not shown) on the base 10. Each of the rear and front corners 13, 14 has embosses 15 projecting inwardly toward the base 10 and defining a beveled guide surface 150 to guide the electronic package (not shown) into the insulative housing 1. Each of the rear corners 13 has a hole 130 extending therethrough for being coupled with the retention plate 2. The insulative housing 1 includes a pair of keys 16 formed at the forward end 12 and in the form of hooks proximate the front corners 14 and opposing to each other.

The retention plate 2 for retaining the electronic package (not shown) includes a planar main plate 20 with a central opening 200 therein and opposed side frame members 21 vertically extending from the main plate 20. The main plate 20 covers the base 10 of the insulative housing 1 and the side frame members 21 extend along sides of the insulative housing 1 such that the retention plate 2 partially covers the insulative housing 1. The retention plate 2 has a pair of tabs 23 extending from rear ends of the side frame members 21. Each tab 23 movably inserts in the hole 130 of the insulative housing 1 and has a stepped distal end 230. The tabs 23 disconnect to the main plate 20.

The retention plate 2 includes a pair of latches 22 formed at a pair of corners thereof and each extending from a front end of the side frame member 21. The latches 22 disconnect to the main plate 20. Each latch 22 has a locking portion 221 extending along the forward end 12 of the insulative housing 1 to be locked to the key 16 and a pressing portion 222 bent from the locking portion 221. The locking portion 221 defines a locking slot 2210 corresponding to the key 16. The pressing portion 222 extends away from a corresponding side of the insulative housing 1 to provide a clearance 223 for allowing elastic deformation of the pressing portion 222. The locking portions 221 is locked or unlocked to the keys 16 by means of pressing the pressing portions 222 inwardly to latch or release the retention plate 2 as will be described in detail hereinafter.

Figure 2:
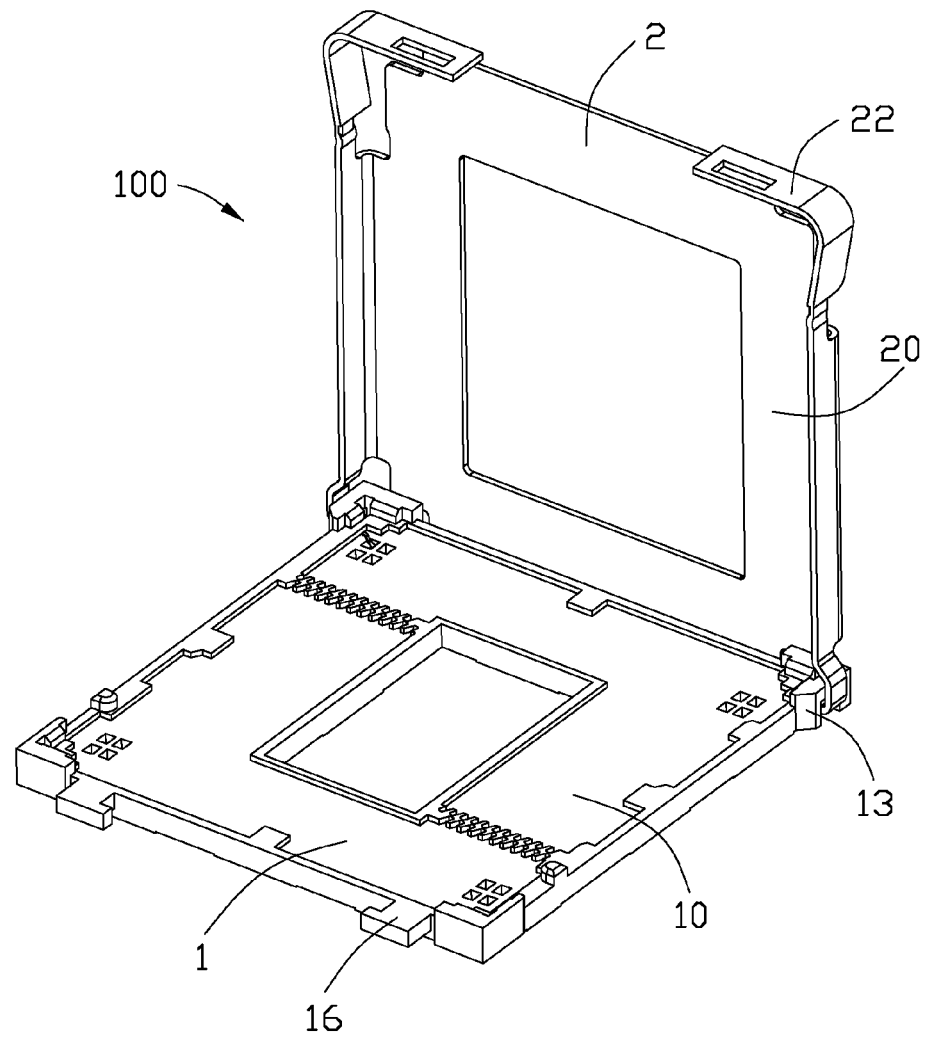
FIG. 2 is an assembled, perspective view of the socket connector shown in FIG. 1, showing the retention plate in an open portion.
Figure 3:
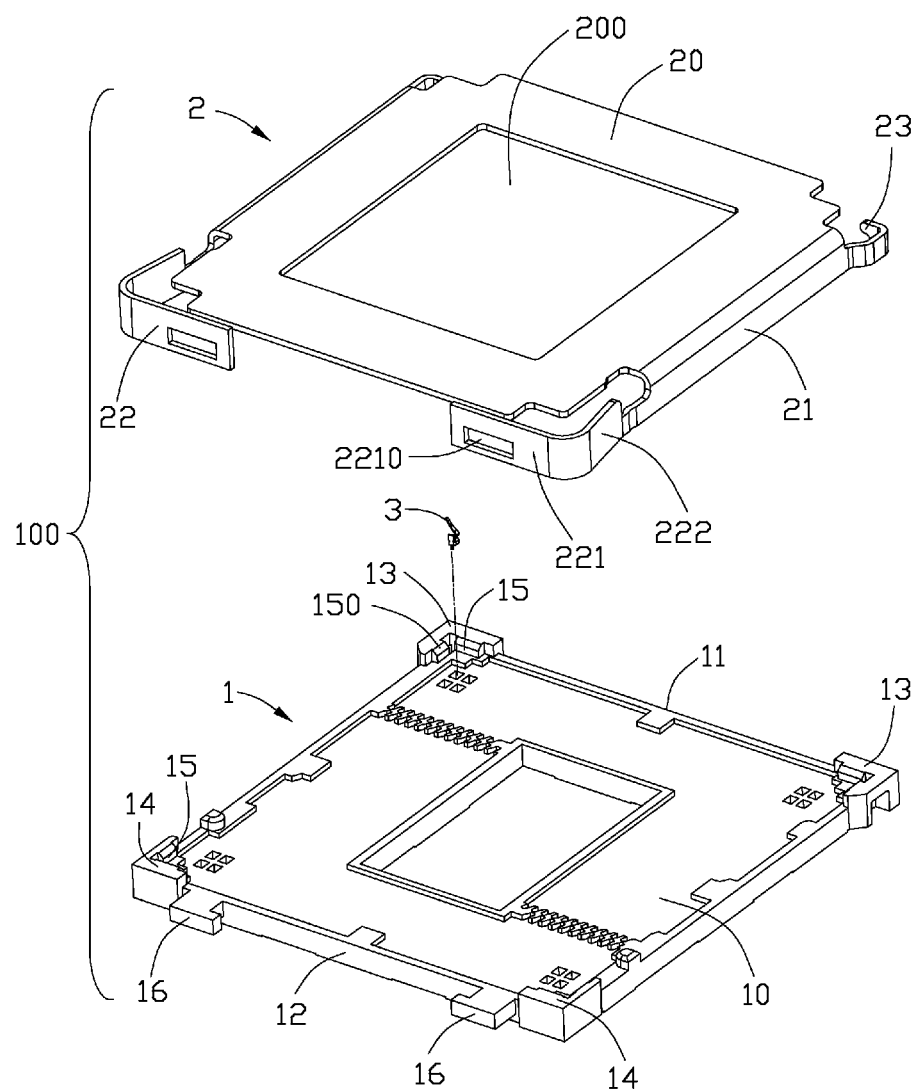
FIG. 3 is an exploded, perspective view of the socket connector shown in FIG. 1.
Figure 4:
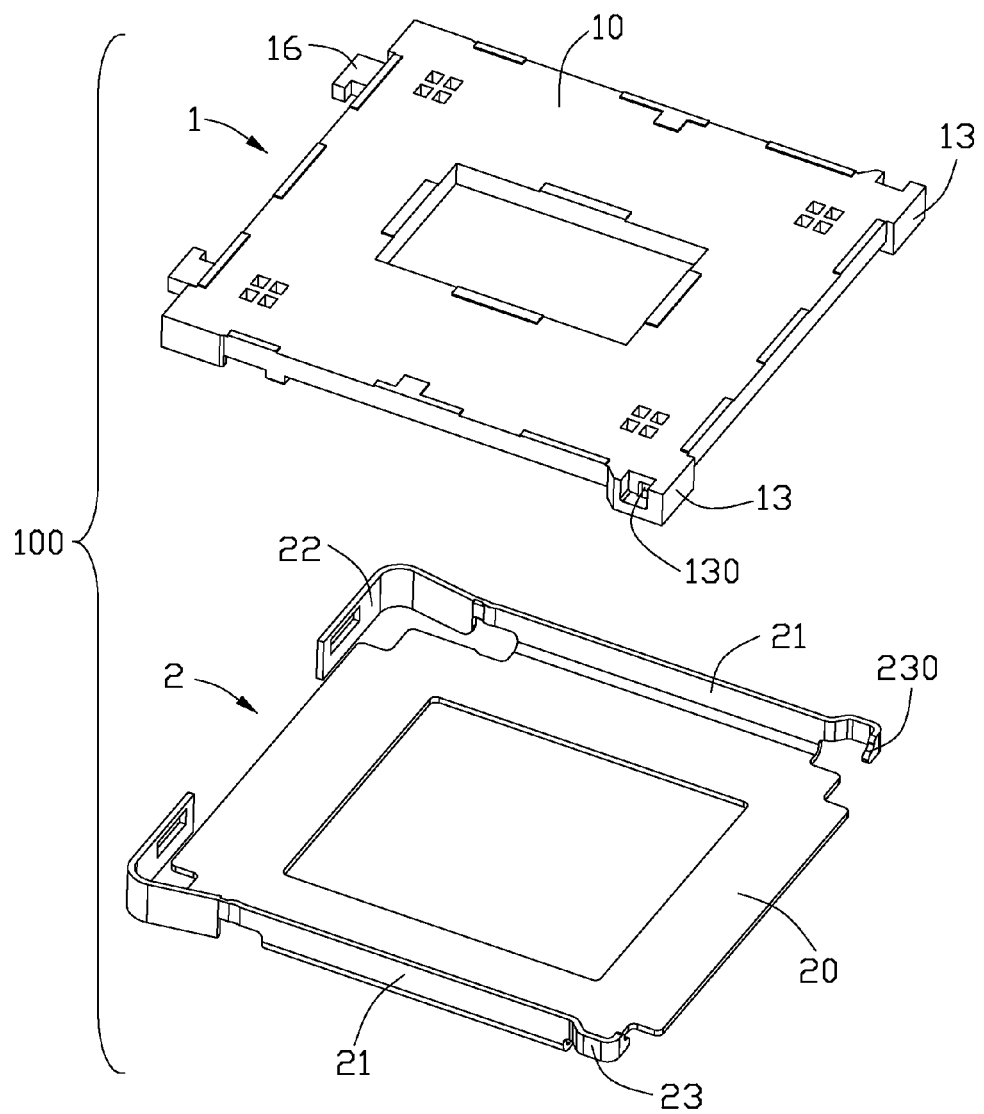
FIG. 4 is another exploded, perspective view of the socket connector shown in FIG. 1.
Figure 5:
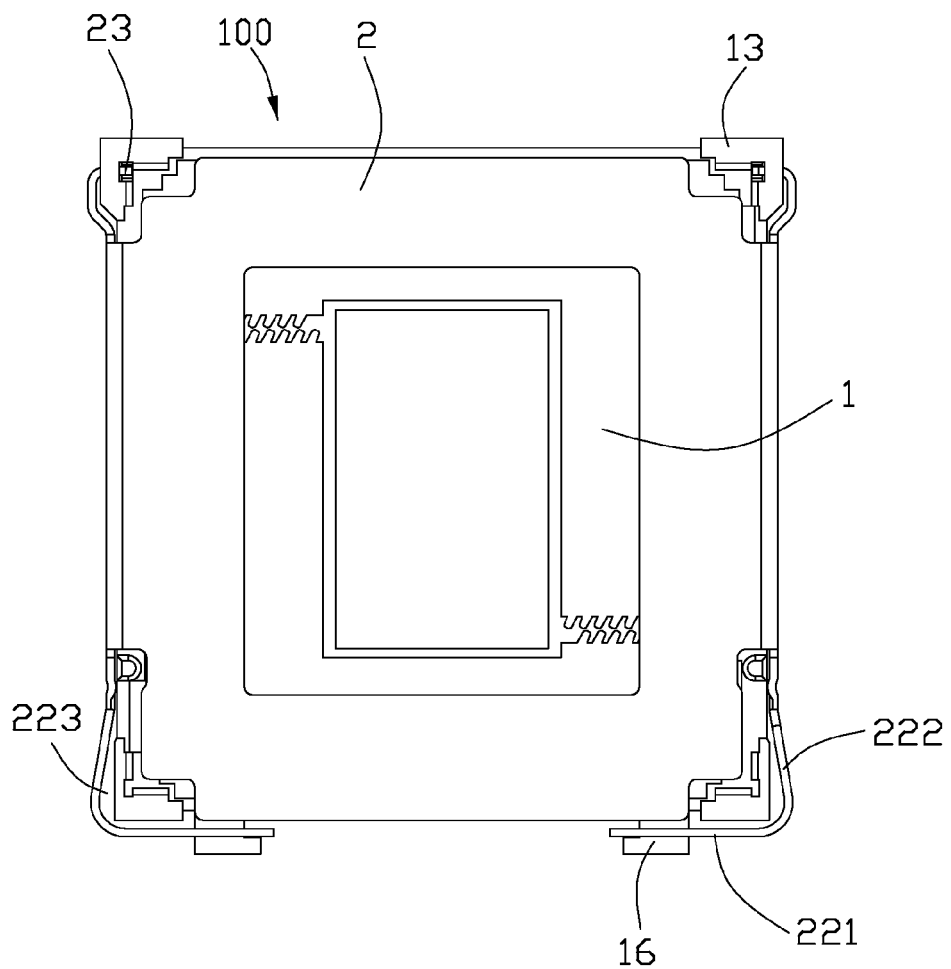
FIG. 5 is a top view of the socket connector shown in FIG. 1.

FIG. 1 illustrates a perspective view of the socket connector 100 with the retention plate 2 in a closed position. FIG. 5 illustrates a top view of the socket connector 100 with the retention plate 2 in a closed position. When closing the retention plate 2, press inwardly the pressing portions 222 of the latches 22 such that the locking portions 221 are moved inwardly until that the locking slots 2210 are aligned with the keys 16. Then push the locking portion 221 toward the keys 16, and at last relieve pressure on the pressing portions 222 so that the locking portions 221 move outwardly. When the retention plate is closed, the keys 16 are held in the locking portions 221. FIG. 2 illustrates a perspective view of the socket connector 100 with the retention plate 2 in the open position. When opening the retention plate 2, press inwardly the pressing portions 222 such that the locking portions 221 move inwardly relatively. When the locking slots 2210 are aligned with the keys 16, the locking portions 221 are released outwardly from the keys 16 due to elasticity thereof.

The locking means is keys 16 coordinating with spring latches 22 that facilitates latching or releasing the retention plate 2. The main plate 20 of the retention plate 2 is not beyond the base 10 of the insulative housing 1 and the side frame members 21 of the retention plate 2 are proximal to corresponding sides of the insulative housing 1, thereby profile of the socket connector 1 is smaller, as a result it saves material and space.

While preferred embodiment in accordance with the present invention has been shown and described, equivalent modifications and changes known to persons skilled in the art according to the spirit of the present invention are considered within the scope of the present invention as defined in the appended claims.

What is claimed is:

1. A socket connector for an electronic package comprising:
    an insulative housing having a pair of keys formed at a forward end thereof;
    a plurality of terminals received in the insulative housing; and
    a retention plate rotatably coupled to the insulative housing at a rearward end thereof and having a pair of latches each including a horizontally triggered locking portion extending from skirts of the retention plate and locking to the key and a pressing portion bent from the locking portion;
    wherein each said key is a hook and said hooks oppose to each other;
    wherein each said locking portion defines a locking slot corresponding to the key;
    wherein each said pressing portion extends away from a corresponding side of the insulative housing to provide a clearance for spring deflection of the pressing portion.

2. The socket connector as claimed in claim 1, wherein the retention plate has a pair of tabs and the insulative housing has holes at corners of the rearward end, the tabs movably inserting in the hole.

3. The socket connector as claimed in claim 2, wherein each said tab has a stepped distal end.

4. The socket connector as claimed in claim 2, wherein the retention plate includes a planar main plate with a central opening therein and opposed side frame members vertically extending from the main plate, the latches and the tabs respectively extending from front and rear ends of the side frame members.

5. A socket connector for an electronic package comprising:
    an insulative housing having a pair of keys formed at a forward end thereof;
    a plurality of terminals received in the insulative housing; and
    a retention plate coupled to the insulative housing at a rearward end thereof and movable between an open position and a closed position, the retention plate having a pair of latches proximate the forward end and each with a locking portion and a pressing position, the locking portions being locked or unlocked to the keys by means of pressing the pressing portions inwardly to latch or release the retention plate;
    wherein each said key is a hook and said hooks oppose to each other;
    wherein each said locking portion extends along the forward end and has a locking slot corresponding to the key;
    wherein each said pressing portion is bent from the locking portion and extends away from a corresponding side of the insulative housing to provide a clearance for spring deflection of the pressing portion.

6. The socket connector as claimed in claim 5, wherein the retention plate has a pair of tabs and the insulative housing has holes at corners of the rearward end, the tabs movably inserting in the hole.

7. The socket connector as claimed in claim 6, wherein each said tab has a stepped distal end.

8. The socket connector as claimed in claim 6, wherein the retention plate includes a planar main plate with a central opening therein and opposed side frame members vertically extending from the main plate, the latches and the tabs respectively extending from front and rear ends of the side frame members.

9. A socket connector comprising:
    a base including an insulative housing defining a electronic package receiving area between opposite front and rear ends in a front-to-back direction;
    a plurality of contacts disposed in the housing with contacting sections exposed in the electronic package receiving area;
    a retention cover pivotally mounted to the rear end and defining a main body to cover the electronic package receiving area in a vertical direction perpendicular to said front-to-back direction when the retention cover is in a locked position, and further including a pair of locking portions spaced from the main body and locked to the front end when the locking portion is in a relatively relaxed manner while is released from the front end when the locking portion is in a relative tensioned manner; wherein
    each of said locking portion is equipped with a pressing portion linked to the main body and being deflectable in a transverse direction perpendicular to both the front-to-back direction and the vertical direction to determine the corresponding locking portion to be in the relatively relaxed manner or the relatively tensioned manner.

10. The socket connector as claimed in claim 9, wherein one of the front end of the housing and the locking portion defines a locking slot, and the other defines a key engaged within the locking slot when the cover is securely mounted to the base.

11. The socket connector as claimed in claim 9, wherein the pressing portions are deflectable toward each other in the transverse direction.

12. The socket connector as claimed in claim 11, wherein the pressing portion extends obliquely and outwardly for easy operation.

13. The socket connector as claimed in claim 9, wherein the locking portion extends in a vertical plane.

14. The socket connector as claimed in claim 13, wherein the pressing portion extends in another vertical plane.

* * * * *